(12) United States Patent
Singhai et al.

(10) Patent No.: US 10,067,823 B2
(45) Date of Patent: Sep. 4, 2018

(54) SYSTEMS AND METHODS FOR ADAPTIVE ERROR CORRECTIVE CODE MECHANISMS

(71) Applicant: HGST Netherlands B.V., Amsterdam (NL)

(72) Inventors: Ashish Singhai, Los Altos, CA (US); Ashwin Narasimha, Los Altos, CA (US); Ajith Kumar, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 546 days.

(21) Appl. No.: 14/560,767

(22) Filed: Dec. 4, 2014

(65) Prior Publication Data

US 2016/0162352 A1 Jun. 9, 2016

(51) Int. Cl.
*G06F 11/10* (2006.01)
*G11C 29/52* (2006.01)

(52) U.S. Cl.
CPC .......... *G06F 11/1048* (2013.01); *G11C 29/52* (2013.01)

(58) Field of Classification Search
CPC ............. G06F 11/1068; G06F 12/0246; G06F 11/1048; G06F 11/1044; G06F 2212/1032; G11C 29/52
See application file for complete search history.

(56) References Cited

U.S. PATENT DOCUMENTS

| | | | |
|---|---|---|---|
| 7,739,576 B2 | 6/2010 | Radke | |
| 7,904,780 B2 * | 3/2011 | Brandman | .......... G06F 11/1068 714/752 |
| 7,953,931 B2 | 5/2011 | Yu et al. | |
| 8,161,354 B2 | 4/2012 | Chen | |
| 8,209,466 B2 | 6/2012 | Garratt | |
| 8,327,226 B2 | 12/2012 | Rub | |
| 8,583,868 B2 | 11/2013 | Belluomini et al. | |
| 8,650,461 B2 | 2/2014 | Shalvi et al. | |
| 8,929,140 B2 * | 1/2015 | Nagashima | ......... G06F 11/1048 365/185.11 |
| 9,477,587 B2 * | 10/2016 | Wong | ................... G06F 12/0207 |
| 9,524,786 B2 * | 12/2016 | Nagashima | ......... G06F 11/1048 |

(Continued)

OTHER PUBLICATIONS

Y. H. Chang and T. W. Kuo, "A commitment-based management strategy for the performance and reliability enhancement of flash-memory systems," 2009 46th ACM/IEEE Design Automation Conference, San Francisco, CA, 2009, pp. 858-863.*

(Continued)

*Primary Examiner* — Cynthia Britt
(74) *Attorney, Agent, or Firm* — McDermott Will & Emery LLP

(57) ABSTRACT

Systems and methods for managing the endurance of a solid state drive by assigning error corrective codes (ECC) to a plurality of solid state drive blocks are provided. The disclosed systems and methods can provide a plurality of error corrective codes, each code having a corresponding correction capability and assign to each solid state drive block an error corrective code, according to a reliability of the solid state drive block. Moreover, the disclosed systems and methods can group the solid state drive blocks into groups according to their assigned error corrective codes and apply, for each group of solid state drive block, a level of ECC correction according to the assigned error corrective code of each group.

16 Claims, 5 Drawing Sheets

(56) References Cited

U.S. PATENT DOCUMENTS

| | | | |
|---|---|---|---|
| 2008/0209114 A1 | 8/2008 | Chow et al. | |
| 2009/0013233 A1* | 1/2009 | Radke | G06F 11/1072 714/752 |
| 2009/0070651 A1* | 3/2009 | Diggs | G06F 11/1068 714/752 |
| 2010/0100797 A1 | 4/2010 | Chen | |
| 2010/0115376 A1* | 5/2010 | Shalvi | G06F 11/1068 714/763 |
| 2011/0060967 A1* | 3/2011 | Warren | G06F 11/1048 714/763 |
| 2011/0060968 A1* | 3/2011 | Warren | G06F 11/1068 714/773 |
| 2011/0167319 A1* | 7/2011 | Jeddeloh | G06F 11/1044 714/763 |
| 2011/0252289 A1* | 10/2011 | Patapoutian | G06F 11/1048 714/763 |
| 2012/0151301 A1* | 6/2012 | Izumi | G06F 11/1048 714/773 |
| 2012/0272123 A1* | 10/2012 | Yeh | G06F 12/0246 714/773 |
| 2013/0054928 A1 | 2/2013 | Im | |
| 2013/0061019 A1 | 3/2013 | Fitzpatrick et al. | |
| 2014/0082460 A1 | 3/2014 | Pangal et al. | |
| 2014/0101379 A1 | 4/2014 | Tomlin | |
| 2014/0136927 A1* | 5/2014 | Li | G06F 11/1048 714/768 |
| 2015/0058697 A1* | 2/2015 | Iwasaki | G06F 11/1048 714/773 |
| 2016/0041870 A1* | 2/2016 | Davis | G06F 11/1048 714/773 |

OTHER PUBLICATIONS

T. H. Chen, Y. Y. Hsiao, Y. T. Hsing and C. W. Wu, "An Adaptive-Rate Error Correction Scheme for NAND Flash Memory," 2009 27th IEEE VLSI Test Symposium, Santa Cruz, CA, 2009, pp. 53-58.*

Wei Lin et al., "A Low power and ultra high reliability LDPC error correction engine with Digital Signal Processing for embedded NAND Flash Controller in 40nm COMS," 2014 Symposium on VLSI Circuits Digest of Technical Papers, Honolulu, HI, 2014, pp. 1-2.*

R. Gabrys and L. Dolecek, "Spatially-aware adaptive error correcting codes for flash memory," 2011 Conference Record of the Forty Fifth Asilomar Conference on Signals, Systems and Computers (ASILOMAR), Pacific Grove, CA, 2011, pp. 28-32.*

Cai, Y. et al., "Flash Correct-and-Refresh: Retention-Aware Error Management for Increased Flash Memory Lifetime," DSSC, Carnegie Mellon University, pp. 1-8 (no date listed).

Liu, D. et al., "PCM-FTL: A Write-Activity-Aware NAND Flash Memory Management Scheme for PCM-Based Enbedded Systems," IEEE Xplore Digital Library,Retreived online[URL:<http://ieeexplore.ieee.org/xpl/login.jsp?tp=arnumber=6121409&url=http%3A%2F%2Fieeexplore.ieee.org%2Fxpls%2Fabs_all.jsp%3Farnumber%3D6121409>], 2 pages (Retrieved on Jul. 2, 2014).

Ryan, Christopher, "Micron P320H HHHL 700GB PCIE Enterprise SSD Review Unbelievable IOPS and Absurd Endurance," Retreived online, [URL: http://www.thessdreview.com/our-reviews/micron-p320h-hhhl-700gb-pcie-enterprize-ss . . . >], Retrieved on Jul. 2, 2014 (3 pages).

White Paper, WP001—Flash Management: A detailed overview of flash managment techniques, SanDisk, 18 pages (Nov. 2013).

* cited by examiner

SYSTEMS AND METHODS FOR ADAPTIVE ERROR CORRECTIVE CODE MECHANISMS

CROSS-REFERENCE TO RELATED APPLICATIONS

This application is related to U.S. patent application Ser. No. 14/560,802, entitled "SYSTEMS AND METHODS FOR MULTI-ZONE DATA TIERING FOR ENDURANCE EXTENSION IN SOLID STATE DRIVES," filed on Dec. 4, 2014, the contents of which are incorporated herein by reference in their entirety.

FIELD

The present disclosure relates to error corrective code (ECC) mechanisms and more specifically to managing the endurance (operational lifetime) and performance of a solid state drive using adaptive error corrective code mechanisms.

BACKGROUND

Flash memories are Electrically Erasable Programmable Read-Only Memory (EEPROM) memories that can be erased and reprogrammed in blocks instead of one byte at a time. A typical flash memory comprises a memory array, which includes a large number of memory cells. The cells are usually grouped into sections called "erase blocks." Each of the cells within an erase block can be electrically programmed. All memory cells in the erase block are erased in a single operation.

Error corrective code requirements for NAND flash memories are increasing as flash memory geometries shrink and the size of each cell is reduced. Next generation NAND flash memories have lower endurance and higher ECC requirements. For example 16 nm NAND flash from one manufacturer might need 40 bits of ECC to achieve 3 k program erase cycles. This is much lower endurance and a much higher ECC requirement than prior generations of NAND flash. At the same time, the endurance requirements of applications have not changed. To meet market needs, a system level approach towards endurance management needs to be taken. There is a direct correlation between the ECC level that a controller can implement and the number of program erase (PE) cycles that a NAND flash can be used for reliably.

Meeting the ECC and endurance requirements within limited resources of Field Programmable Gate Arrays (FPGAs) requires careful system design. Further, additional NAND flash memory requirements include reducing the overall power of the ECC subsystem, which, in some instances, can account for over 80% of the logic on a high performance NAND flash controller.

SUMMARY

Systems and methods for managing the endurance of a solid state drive by assigning error corrective codes (ECC) to a plurality of solid state drive blocks are provided. According to aspects of the present disclosure a method for managing the endurance of a solid state drive can provide a plurality of error corrective codes, each code having a corresponding correction capability and assign to each solid state drive block an error corrective code, according to a reliability of the solid state drive block. The disclosed method can further group the solid state drive blocks into groups according to their assigned error corrective codes and apply, for each group of solid state drive block, a level of ECC correction according to the assigned error corrective code of each group.

According to aspects of the present disclosure, a memory controller for managing the endurance of a solid state drive can include a controller module configured to communicate with a solid state drive having a plurality of blocks and provide a plurality of error corrective codes, each code having a corresponding correction capability. The controller module can further be configured to assign to each solid state drive block an error corrective code, according to a reliability of the solid state drive block, group the solid state drive blocks into groups according to their assigned error corrective codes, and apply, for each group of solid state drive block, a level of ECC correction according to the assigned error corrective code of each group.

These and other embodiments will be described in greater detail in the remainder of the specification referring to the drawings.

DESCRIPTION

According to aspects of the present disclosure, systems and methods extend the endurance of a solid state drive by managing the error correction mechanisms applied to different blocks of the solid state drive. The disclosed methods assign an appropriate level of error correction to each block based on the reliability of each block. The reliability of each block is frequently monitored, and, if it changes, the disclosed methods re-assign a different level of error correction to the block, according to the changed reliability.

Figure 1:
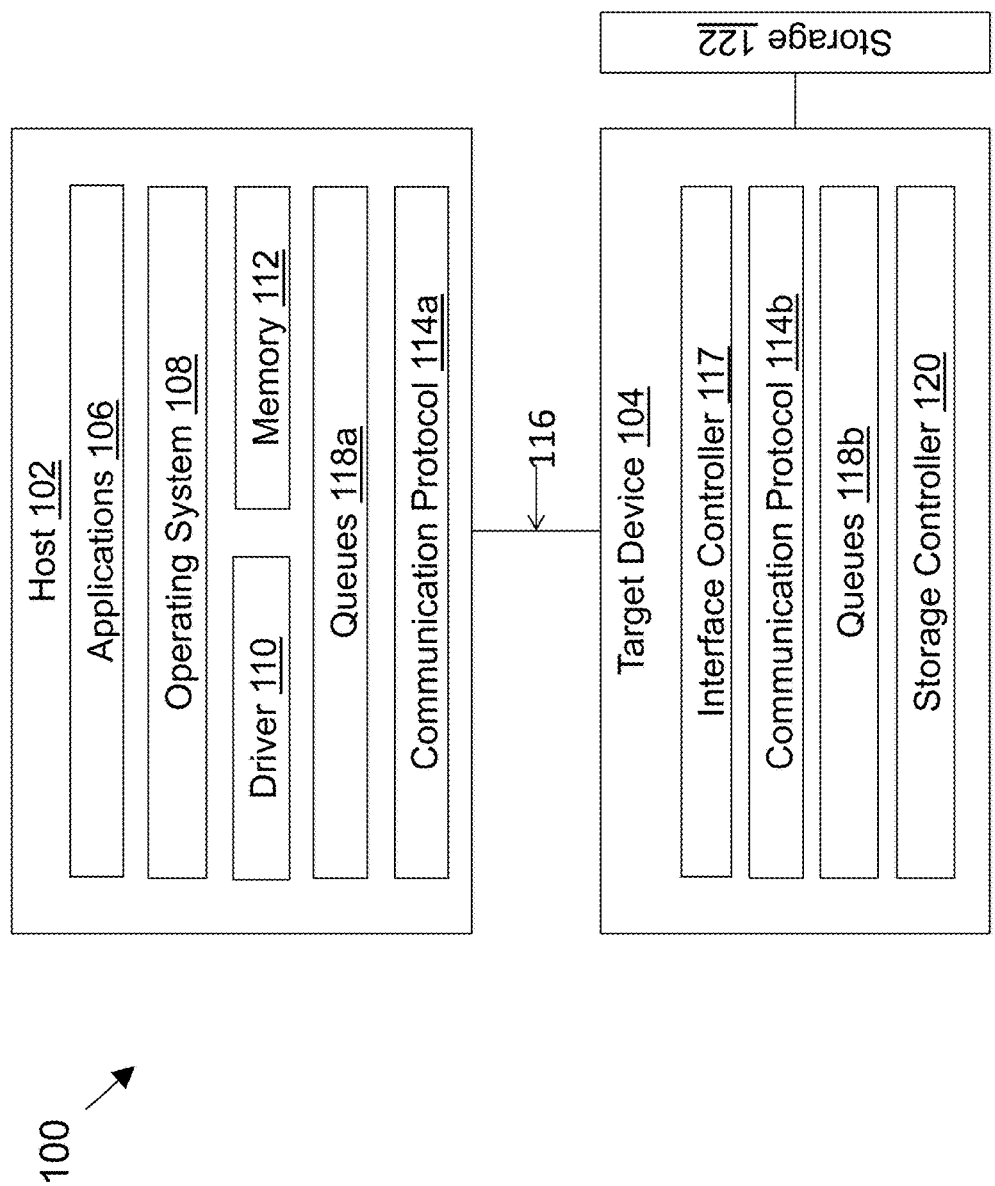
FIG. 1 illustrates an exemplary system implementing a communication protocol, in accordance with some embodiments of the present disclosure.

FIG. 1 illustrates an exemplary system 100 implementing a communication protocol, in accordance with some embodiments of the present disclosure. System 100 can include host 102 in communication with target device 104 and storage 122. Host 102 can include user applications 106, operating system 108, driver 110, host memory 112, queues 118a, and communication protocol 114a. Target device 104 can include interface controller 117, communication protocol 114b, queues 118b, and storage controller 120 in communication with storage 122. According to aspects of the present disclosure, a solid state drive (SSD) controller, for example, storage controller 120, can include logic for implementing error correction during data retrieval from storage 122. For example, storage controller 120 can implement one or more error correction code (ECC) engines that implement the error correction scheme of system 100.

Host 102 can run user-level applications 106 on operating system 108. Operating system 108 can run driver 110 that interfaces with host memory 112. In some embodiments, memory 112 can be dynamic random access memory (DRAM). Host memory 112 can use queues 118a to store commands from host 102 for target 104 to process. Examples of stored or enqueued commands can include read operations from host 102. Communication protocol 114a can allow host 102 to communicate with target device 104 using interface controller 117.

Target device 104 can communicate with host 102 using interface controller 117 and communication protocol 114b. Communication protocol 114b can provide queues 118 to access storage 122 via storage controller 120. Target device 104 can implement the disclosed methods by assigning the appropriate level of error correction to blocks of storage 122.

Figure 2:
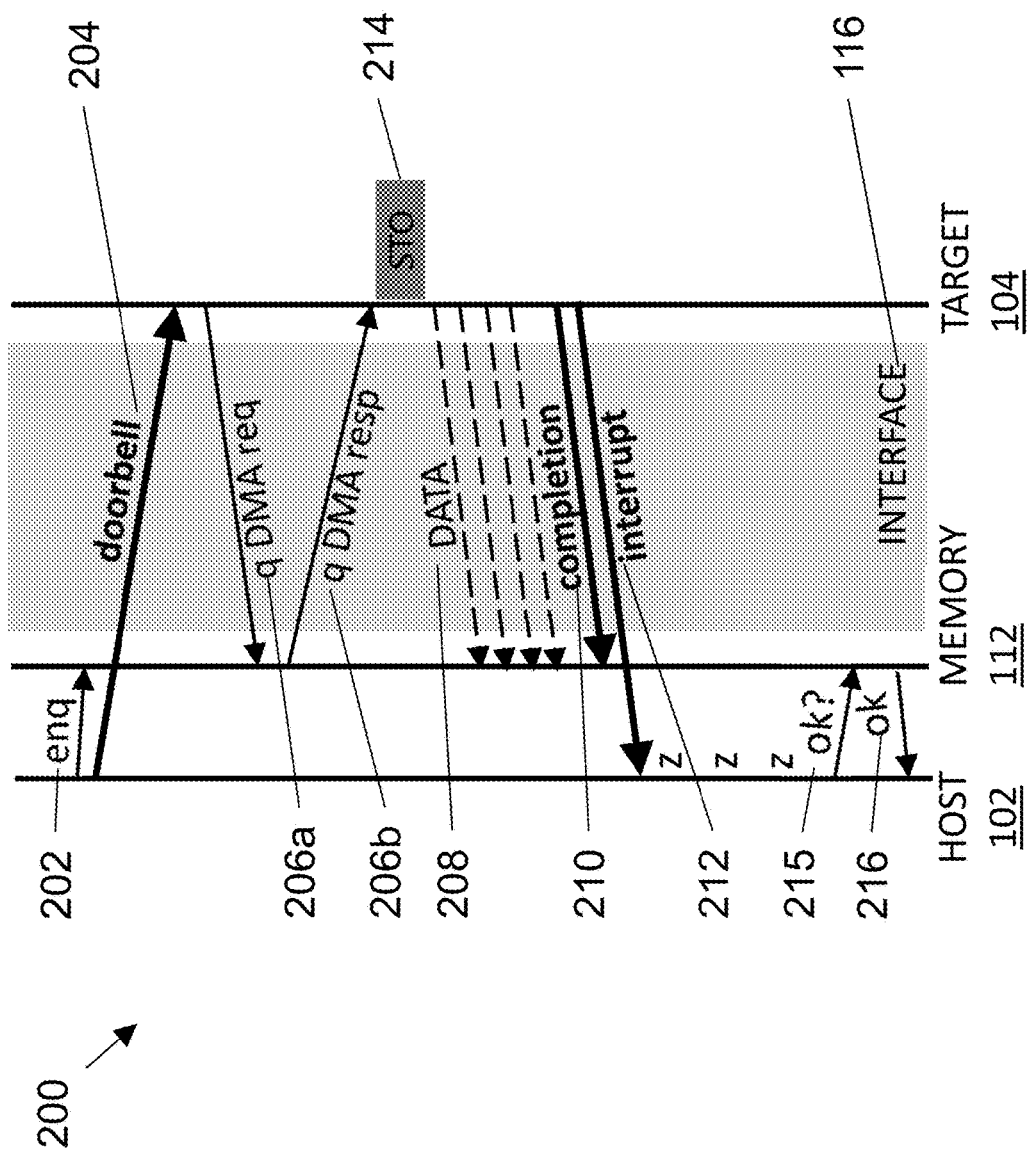
FIG. 2 illustrates an example message flow of a Non-Volatile Memory Express (NVMe)-compliant read operation, in accordance with some embodiments of the present disclosure.

FIG. 2 illustrates an example message flow 200 of a communication protocol, in accordance with aspects of the present disclosure. FIG. 2 illustrates host 102 in communication with host memory 112 and target 104 over interface 116, wherein the protocol utilizes error correction schemes. For example, interface 116 can implement an NVM Express (NVMe) communication protocol.

The message flow and timing diagram shown in FIG. 2 is for illustrative purposes. Time is generally shown flowing down, and the illustrated timing is not to scale. The communication protocol for reading a block from target 104 can begin with host 102 preparing and enqueuing a read command in host memory 112 (step 202) and initiating the transaction by sending a "doorbell" packet (step 204) over interface 116 (e.g., PCI Express). The doorbell signals the target device that there is a new command waiting, such as a read command. In response, the target device can initiate a direct memory access (DMA) request—resulting in transmission of another PCI Express packet—to retrieve the enqueued command from the queue in memory 112 (step 206a).

Specifically, host 102 can enqueue ("enq") a command (step 202) such as a read command, and can ring a command availability signal ("doorbell") (step 204). In some embodiments, host 102 can include a CPU that interacts with host memory 112. The doorbell signal can represent a command availability signal that host 102 uses to indicate to the device that a command is available in a queue in memory 112 for the device to retrieve. In response to receiving the doorbell signal, the device can send a command request to retrieve the queue entry (step 206a). For example, the command request can be a direct memory access (DMA) request for the queue entry. The device can receive the requested entry from the queue (step 206b). For example, the device can receive the DMA response from memory 112 on host 102. The device can parse the command in the queue (e.g., the read command), and execute the command. For example, the device can send the requested data packets to memory 112 (step 208). Rectangle 214 illustrates an amount of time when the device actually reads storage data. Reading data from storage requires implementing error correction schemes while retrieving the data from the storage device memory cells. Error correction schemes ensure that data from storage is retrieved error free. As discussed in detail below, the disclosed methods can monitor the errors while retrieving data from storage 122 for determining the appropriate error correction scheme for each block.

After the device has completed sending the requested data, the device can write an entry, or acknowledgement signal, into a completion queue (step 210). The device can further assert an interrupt that notifies the host that the device has finished writing the requested data (step 212). A thread on the CPU on host 102 can handle the interrupt. From the time the interrupt signal reaches the CPU on host 102, it takes many cycles to do the context switch and carry on with the thread that was waiting for the data from target 104. Hence, the thread can be considered as if it is "sleeping" for a few microseconds after the interrupt arrives. Subsequently, when the CPU on the host 102 wakes up, it can query the host memory 112 to confirm that the completion signal is in fact in the completion queue (step 215). Memory 112 can respond back to the host CPU with a confirmation when the completion signal is in the completion queue (step 216).

As discussed above, retrieving data from NVM storage device 122, can involve implementing error correcting schemes that ensure that the data from storage is retrieved error free. Different error correcting schemes, for example, BCH code (from the acronyms of the code inventors, Raj Bose, D. K. Ray-Chaudhuri, and Alexis Hocquenghem) and low-density parity-check (LDPC) code, have different performance and area requirements. An ECC implementation that can provide significant error corrections usually can require a significant portion of the storage device and also has an adverse effect on performance, because the error correction algorithm can be time consuming. Therefore, there are different trade-offs associated with each particular ECC implementation, that typically relate to (1) space efficiency of the implementation, (2) latency of the error correction mechanism, (3) the error correction capability, and (4) architectural decisions, that relate, for example, to the number of error correction engine modules and the size of each module.

Balancing these tradeoffs usually determines the type of the ECC mechanism implemented in a flash memory device. Typical error correction implementations use a single type of ECC mechanism, for example, BCH. However, the ability of a storage device to return error free data deteriorates over time. Therefore, an ECC mechanism that is appropriate for a flash storage device at the beginning of life of the storage device, when the flash memory error count is low, may not be appropriate near the end of life of the storage device, when the error count is significantly higher. If the error correction mechanism cannot provide adequate error correction, then the memory device needs to be replaced.

In addition, not all area of the flash storage device deteriorates equally with time. Flash storage cells of the same flash storage device can exhibit different error counts. The difference in the error counts of the flash memory cells is a function of many parameters, for example, fabrication technology, cell impurities, and cell usage. For example, if one cell has more impurities compared to another cell in the same flash storage device, then it will exhibit a higher number of error counts compared to a cell with less impurities. Moreover, cells who are accessed more frequently, because, for example, of read-write traffic patterns, can also exhibit a higher number of error counts compared to others who are less frequently accessed. Accordingly, in both situations, the memory area will lose the ability to refresh the cell more quickly and overall performance will suffer.

Figure 3:
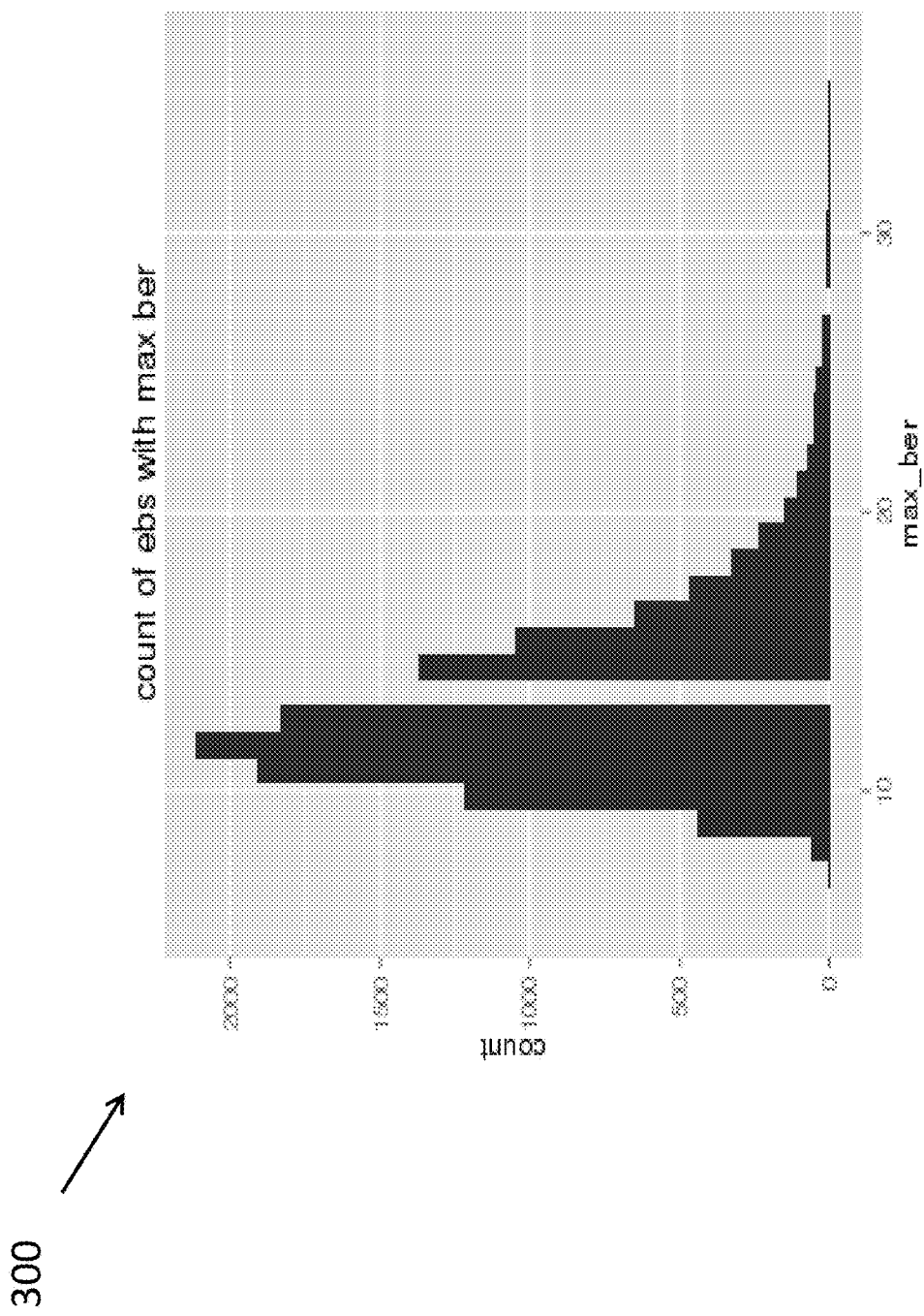
FIG. 3 shows a maximum error counts distribution at end of life ("EOL") with retention for a 20 nm consumer multi-level cell (cMLC) flash memory.

Specifically, flash erase blocks exhibit a normal distribution of error counts at a given program-erase (PE) cycle endurance level. This is illustrated in FIG. 3, which is a snapshot of the system state at the end of life. FIG. 3, generally at 100, shows the distribution of errors in ECC code words at end-of-life. The "x" axis shows, for different code words, the number of errors allowed per code word and the "y" axis shows the error count for the different code words. The error count information for the code word with fourteen error bits allowed is missing from the graph. The graph is representative of the information that can be used to determine the appropriate distribution of correction levels at end of life. Specifically, the information in the graph shows that flash erase blocks exhibit a normal distribution of error counts. The distribution starts off being relatively narrow at the beginning of life of the flash storage device, but flattens out as the device ages. This flattening at the end of life as illustrated in FIG. 3, shows the distribution of error counts having a noticeable "width" or standard deviation. Despite of the flattening, even at the end of life of a flash storage device, a significant number of flash erase blocks exhibit relatively smaller numbers of errors with particular code words. Therefore, even at the end of life, these flash erase blocks can be used for reading and writing data, if the appropriate code words is used.

The disclosed adaptive ECC systems and methods can take advantage of this latter property. Instead of implementing a single ECC mechanism, as employed in typical implementations, the disclosed systems and methods can implement different error correction schemes on different blocks within a single flash memory drive. Moreover, the disclosed systems and methods can change the particular error correction scheme implemented on a particular block over time, as the ECC requirements of a particular block changes over time. Consequently, the disclosed systems and methods can extend the endurance and improve the performance and power of a solid state drive. For example, the endurance of the solid state drive can be extended, because a better error correction scheme can be used on blocks and cells that exhibit high error count. Therefore, with the better error correction scheme, the particular blocks and cells can still be used for read and write operations for an extended period, for example near the end of life of the storage device. In addition, the disclosed systems and methods can assign a faster error correction scheme to blocks and cells with low error count, because in this case, a time consuming error correction code with great correction capabilities is not required. Moreover, a faster error correction scheme dissipates less power than one that requires a lot of computational time for implementing sophisticated coding and encoding techniques. Accordingly, the overall performance and power of the solid state drive improves due to the reduced error correction scheme overhead. In addition, the disclosed methods and systems offers storage capacity benefits, because there is no need to expend unnecessary storage capacity to store unneeded levels of ECC code word data.

Because, the disclosed systems and methods allocate an appropriate error correction scheme to particular storage device blocks or cells based on their corresponding error counts, an accurate account of the error counts is preferable. According to aspects of the disclosure, program-erase (PE) cycles can serve as a criterion for quantifying the error counts of flash storage device blocks and cells and, consequently, quantifying the endurance of a flash storage device. For example, low endurance can correspond to three thousand PE Cycles, while a high endurance can correspond to thirty thousand PE cycles. A program-erase cycle is a sequence of events in which data is written to solid-state NAND flash memory cell, then erased, and then rewritten to the memory cell.

Once the appropriate error count has been determined for the different erase blocks, the disclosed methods identify the proper ECC correction scheme for different erase blocks, by grouping the erase blocks into different reliability categories and applying different levels of ECC correction capability to the erase blocks. The disclosed methods include instrumentation logic and heuristics for determining the appropriate configuration of error correction capabilities for the different flash regions that correspond to the different reliability categories.

Figure 4:
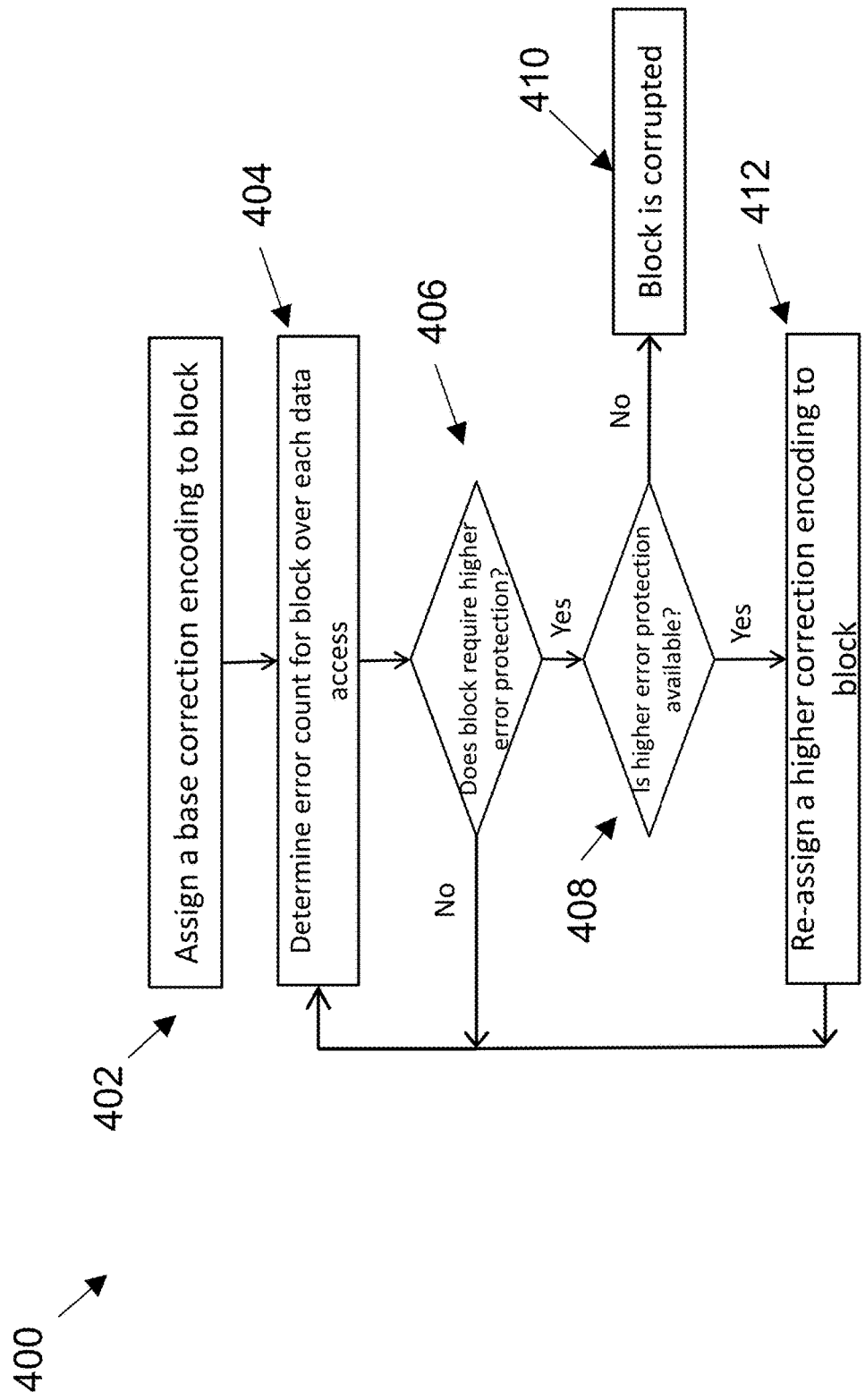
FIGS. 4-5 show exemplary methods for assigning error correction encodings to memory blocks, according to aspects of the present disclosure.

For example, FIG. 4 shows an exemplary method 400 for determining the appropriate correction encodings to each flash memory block, according to aspects of the present disclosure. The method starts by assigning a base error correction encoding to the flash memory blocks 402. Typically, at the beginning of the life of a flash memory, it is expected that the blocks will not exhibit a high error count. Accordingly, a base error correction encoding can be assigned to the blocks. During the life of the flash memory, the blocks and cells will start degrading, which would result in increased error counts. Because, as explained above, different blocks deteriorate at different rates, the disclosed method determines the error counts for each block 404 and further determines whether the block requires higher error protection 406, for example, based on the error count number and the current error protection. If the block does not require additional error protection, then the method does not change the assigned error protection for the block and continues determining the error count for the block, for example, on every read/write operation associated with the block. If at step 406, the method determines that the block requires additional error protection, then it checks whether higher error protection is available 408. If there is no higher error protection available, then the method marks the particular block as corrupted 410. If, on the other hand, there is higher correction encoding available, then it is assigned to the block 412, and the method continues determining the error count for the block 404.

According to alternative aspects of the present disclosure, the disclosed methods can support different data layouts for different flash blocks. These data layouts correspond to different amounts of write block area that is set aside for storing ECC information associated with user data stored in that block.

Tables 1 and 2 show candidate data layouts that can be used by the disclosed adaptive ECC mechanisms for 20 nm and 16 nm flash storage devices respectively. The data layouts are for illustration only and this scheme can be extended to accommodate any potential flash data layout. In the example layout the error correction capability that can be achieved assumes that we can use zero, one or more 1056 byte sectors to store ECC parity information in the NAND flash page. In the example that follows we demonstrate what happens when 16, 15, 14, and 13 rows of 1056 B data sectors are stored in a 16 KB write page.

In Tables 1 and 2, "ECC Level" refers to the maximum level of errors that can be tolerated in a particular code word per 1 KB. The "ECC Alert" is a mechanism that is used to signal that some threshold of correction has been reached or triggered, and that some action to mitigate the risk of having an uncorrectable data corruption is required. As the ECC capabilities increase the number of bytes in a flash page used to store parity bytes will increase. Accordingly, the available storage in the flash dedicated for storing user data will decrease. In both cases, the ECC level has been configured to be the maximum correction capability that can be afforded by the spare bytes available in the page. As explained above, higher error correction capabilities have an adverse effect on the flash area, because of the additional area required by the error correction mechanism to store the ECC code words. However, using these data layouts, one can trade off the correction capability for the amount of flash capacity set aside for storing the associated ECC information.

TABLE 1

Data Layouts used by Adaptive ECC Mechanisms for 20 nm flash

| ECC Level (per 1 KB) | ECC Alert Level | DATA LAYOUT (# of 1056B sectors) | Comments |
|---|---|---|---|
| 24 | 21 | 16 | Base Encoding |
| 66 | 60 | 15 | Endurance Encoding |
| 80 | 75 | 14 | Endurance Encoding II |
| 80 + LDPC | — | 13 | Enhanced Endurance Encoding |

TABLE 2

Candidate Data Layouts used by Adaptive ECC mechanisms for 16 nm flash

| ECC Level (per 1 KB) | ECC Alert Level | DATA LAYOUT (# of 1056B sectors) | Comments |
|---|---|---|---|
| 48 | 21 | 16 | Base Encoding |
| 80 | 75 | 15 | Endurance Encoding |
| 80 + LDPC | — | 14 | Enhanced Endurance Encoding |

To help understand the benefits that might result from such adaptive selection of data layouts, Tables 3A and 3B compare the aggregate bytes that can be written to a write page using a fixed versus an adaptive approach, as the device is cycled up to 36K PE cycles. Table 3A corresponds to a fixed approach, while table 3B corresponds to the proposed adaptive (bottom) approach. Each row in both tables shows the expected distribution of erase blocks (EB) across the different data layouts and reliability categories. The fixed approach always uses the data layout where 14 rows of 1056 B are stored in the write page. This corresponds to an error correction capability of 80 bits/1 KB, considered the minimum required on 16 nm flash to achieve any endurance enhancements beyond manufacturer specification. The adaptive approach uses different data layouts for different erase blocks; Table 3 shows expected values of average rows per page, based on the normal distribution of errors illustrated in FIG. 3.

Table 3 shows the percentile benefit from implementing the proposed adaptive scheme. The benefit can be expressed as the higher number of bytes that can be written into the memory because of the fewer number of data rows that the ECC bytes use. The benefits from the adaptive scheme can range from [(99475200−95040000)/95040000]=4.67% in aggregate bytes written at 6K PE cycles to [(96497280−95040000)/95040000]=1.53% at 24K PE cycles, for a 16 nm flash memory. The adaptive scheme provides a higher level of error correction capability, because of the LDPC decoder, than the fixed scheme, so may well be the only approach able to deliver increased endurance. Independent of this, although the benefit is modeled in terms of device endurance improvements, the same benefit is perhaps better realized as either an increase in advertised capacity for the same endurance level, or increased write overprovisioning margin for the same endurance and same advertised capacity. The latter two benefits are significant because they impact gross margin or random write performance in a super-linear fashion.

TABLE 3A

Aggregate Bytes Written to a Write Page using a Fixed Approach in a 16 nm flash.

| | Distribution of EBs across Data Layouts for 16 nm flash | | | | | |
|---|---|---|---|---|---|---|
| PE cycle | 16 rows/ page | 15 rows/ page | 14 rows/ page | 13 rows/ page | Avg rows/ page | Bytes written/ page |
| 0 | 0.0% | 100.0% | 0.0% | 0.0% | 15 | 95040000 |
| 6000 | 0.0% | 100.0% | 0.0% | 0.0% | 15 | 95040000 |
| 12000 | 0.0% | 100.0% | 0.0% | 0.0% | 15 | 95040000 |
| 18000 | 0.0% | 100.0% | 0.0% | 0.0% | 15 | 95040000 |
| 24000 | 0.0% | 100.0% | 0.0% | 0.0% | 15 | 95040000 |

TABLE 3B

Aggregate Bytes Written to a Write Page using an Adaptive Approach in a 16 nm flash

| | Distribution of EBs across Data Layouts for 16 nm flash | | | | | | |
|---|---|---|---|---|---|---|---|
| PE | 16 | 15 | 14 | 13 | | Avg rows/page | Bytes written/page | Benefit % |
| 0 | 90.0% | 10.0% | 0.0% | 0.0% | 100% | 15.9 | 100742400 | 6.00 |
| 6000 | 70.0% | 30.0% | 0.0% | 0.0% | 100% | 15.7 | 99475200 | 4.67 |
| 12000 | 50.0% | 49.0% | 1.0% | 0.0% | 100% | 15.49 | 98144640 | 3.27 |
| 18000 | 35.0% | 60.0% | 5.0% | 0.0% | 100% | 15.3 | 96940800 | 2.00 |
| 24000 | 30.0% | 63.0% | 7.0% | 0.0% | 100% | 15.23 | 96497280 | 1.53 |

The effectiveness of the adaptive ECC mechanism also depends upon heuristics to decide which reliability category is most appropriate for a given flash block. The heuristics can be guided by both static metrics as well as dynamic metrics. For example, static metrics can include the PE cycle of the block, whether or not the block ever required a read-retry operation to recover from a read error, etc. Examples of dynamic metrics can include the count and magnitude of correctable errors, the number of read retries needed for the block, and the count of uncorrectable errors (hopefully, all fixed using RAID retry). Count of correctable errors is the number of instances of errors, e.g., the number of code words that need correction, while magnitude is the amount of errors per code word that need to be corrected.

According to aspects of the present disclosure, the system and methods track these metrics and transitions a flash block from one reliability category to another based on the observed block characteristics. At the start of life of the flash storage device, the flash storage device is expected to start with the lowest level of ECC relying on the fact that all flash is not equally bad and as a block degrades, because, for example, of average bit errors increase, retry levels increase, uncorrectable errors, and RAID failures, the disclosed methods would gradually increase the ECC level culminating at a maximum level of 80 b/1 kbyte+low-density parity-check (LDPC).

Figure 5:
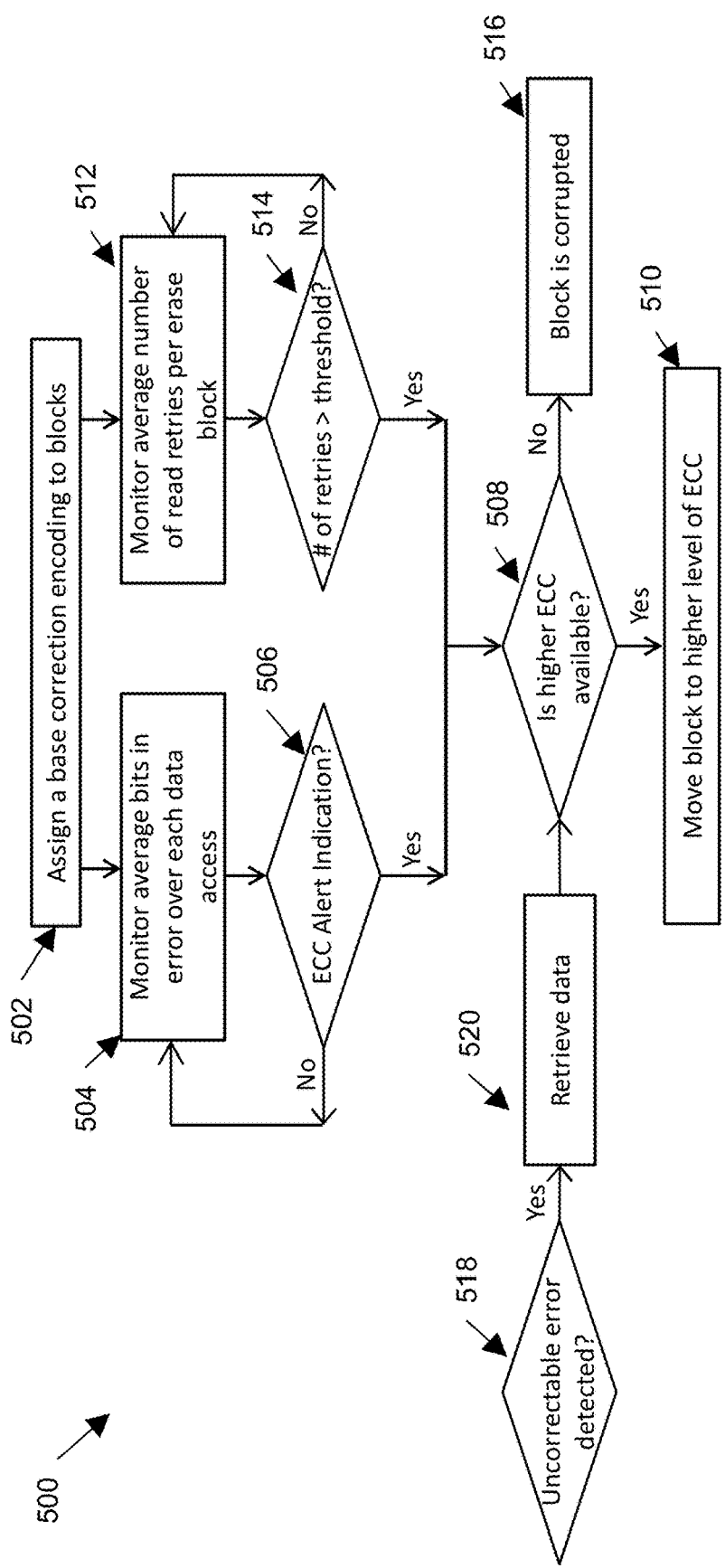

According to aspects of the present disclosure, an alternative method to the method illustrated in FIG. 4, for allocating different levels of error correction according to ECC levels is illustrated in FIG. 5. A base error correction encoding to the memory blocks (502). The method can monitor the average bits in error over each data access at a single erase block granularity (504). For example, the method can sample the bit errors over a statistically significant number of accesses for that particular erase block. This can be used as explained below to determine whether to proactively move the data block to the next level of ECC protection. If there is an ECC Alert indication (506), the method can check whether there is a higher ECC available (508), and in that case, the method moves the particular block to the next level of ECC (510). If there is no higher ECC available, then the method can determine that the particular block is corrupted (516).

Modern flash devices have mechanisms that allow flash controllers to change the sensitivity of internal analog functions within the flash die to recover unreadable data. This is known as a read retry. The method can monitor the average number of read retries per block (512). If the number of read retries is higher than a threshold (514), then similarly to the case of an ECC Alert indication, the method can check whether there is a higher ECC available (508), and in that case, the method moves the particular block to the next level of ECC (510). If there is no higher ECC available, then the method can determine that the particular block is corrupted (516). In this case, the method can instruct the memory controller to stop using the particular block for memory read and write operations.

In addition, the method can provide a background read process that will periodically read through the entire device to proactively find any grown weakness. If during the background read process, the method determines that there is an uncorrectable error (518), this would imply that the ECC mechanism, for example, BCH failed, and all automatic retries failed. Using BCH as an example, every codeword is encoded with a BCH parity when it is written. Every codeword is checked using the BCH parity when it is read. If the number of errors in a codeword exceeds the correction capability of the chosen BCH code, the codeword is deemed uncorrectable. In this situation, the method can use RAID recovery to retrieve the data 520. When a particular level of ECC is unable to recover correct data due to high incidence of errors (beyond the level of that ECC scheme), we can look at system level techniques such as parity based RAID, erasure codes, or multiple copies to recover data. Some schemes, like LDPC, are amenable to retries too.

After the data has been retrieved, the method can check whether there is a higher ECC available (508), and in that case, the method moves the particular block to the next level of ECC (510). If there is no higher ECC available, then the method can determine that the particular block is corrupted (516). A corrupted block can no longer be used.

The ECC mechanisms of the disclosed systems and methods can be implemented as a combination of firmware and hardware. The firmware can provide the control logic for exploiting the run-time flexibility of ECC selection implemented in hardware. For example, the hardware can implement all the common path ECC acceleration mechanisms while the firmware can implement the heuristic and decision making processes. Specifically, the firmware can tag each read or write operation with the associated error correction scheme. This tag can be used by the hardware to configure the encoder mechanisms of the ECC complex to produce the required error correction information.

Read and write operations against flash storage device regions can identify the selected configuration as part of the operation setup. By exploiting this flexibility, the driver can set the capacity for ECC code word storage on an as-required basis, for example, at the block level, as opposed to conservatively pre-allocating space for ECC code words for each block. Accordingly, aggregate ECC code word storage can be optimized, because each block can have appropriate ECC code words, based on a required error protection. This also results in optimization in write overprovisioning, and, consequently, random write performance, for a given expected level of flash degradation.

According to other aspects of the present disclosure, the disclosed methods provide mechanisms to track the error characteristics seen by a flash block over time in a persistent fashion, i.e., these error characteristics are preserved between power cycles of the system. These characteristics are used to classify the erase block into one reliability category versus another. In addition, the disclosed methods provide policies that manage the transition of the block from a baseline reliability category, for example, a lowest level of ECC, to another reliability category associated with higher levels of error correction capability. Those policies can be triggered based on static and dynamic information associated with the flash block, as discussed above.

The embodiments of the present disclosure were discussed in connection with flash memories. Those of skill in the art would appreciate however, that the systems and methods disclosed herein are applicable to all memories that can have a variation in the error correction requirements across various portions of the array or across multiple devices.

Those of skill in the art would appreciate that the various illustrations in the specification and drawings described herein can be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware, software, or a combination depends upon the particular application and design constraints imposed on the overall system. Skilled artisans can implement the described functionality in varying ways for each particular application. Various components and blocks can be arranged differently (for example, arranged in a different order, or partitioned in a different way) all without departing from the scope of the subject technology.

Furthermore, an implementation of the communication protocol can be realized in a centralized fashion in one computer system, or in a distributed fashion where different elements are spread across several interconnected computer systems. Any kind of computer system, or other apparatus adapted for carrying out the methods described herein, is suited to perform the functions described herein.

A typical combination of hardware and software could be a general purpose computer system with a computer program that, when being loaded and executed, controls the computer system such that it carries out the methods described herein. The methods for the communications protocol can also be embedded in a computer program product, which comprises all the features enabling the implementation of the methods described herein, and which, when loaded in a computer system is able to carry out these methods.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Significantly, this communications protocol can be embodied in other specific forms without departing from the spirit or essential attributes thereof, and accordingly, reference should be had to the following claims, rather than to the foregoing specification, as indicating the scope of the invention.

The communications protocol has been described in detail with specific reference to these illustrated embodiments. It will be apparent, however, that various modifications and changes can be made within the spirit and scope of the disclosure as described in the foregoing specification, and such modifications and changes are to be considered equivalents and part of this disclosure.

What is claimed is:

1. method for managing an endurance of a solid state drive, comprising:
   providing a plurality of error corrective code (ECC) mechanisms, each mechanism having a corresponding correction capability;
   assigning to each solid state drive block of a plurality of solid state drive blocks an error corrective code mechanism of the plurality of ECC mechanisms, according to a reliability of the solid state drive block;
   monitoring the reliability of each solid state drive block based on a number of read-retry operations;
   determining the number of read-retry operations associated with a first solid state drive block satisfies a threshold;
   re-assigning to the first solid state block a different ECC mechanism of the plurality of ECC mechanisms based on the determination; and
   applying, for the first solid state drive block, the different ECC mechanism for data operations in the first solid state drive block.

2. The method of claim 1, wherein the different ECC mechanism is associated with a higher level of error correction than a previous ECC mechanism assigned to the first solid state drive block.

3. The method of claim 1, wherein monitoring the reliability of the first solid state drive block is further based on at least one of a static rule and a dynamic rule.

4. The method of claim 3, wherein the static rule includes at least one of a program-erase cycle of the first solid state drive block and read-retry operation information.

5. The method of claim 3, wherein the dynamic rule includes at least one of a count of correctable errors, and a count of uncorrectable errors.

6. The method of claim 1, further comprising determining that the reliability of the first solid state drive block has changed based on an uncorrectable error associated with the first solid state drive block.

7. The method of claim 6, further comprising recovering data stored in the first solid state drive block.

8. The method of claim 7, further comprising determining that the first solid state drive block is corrupted.

9. A memory controller comprising:
   a controller module configured to:
   communicate with a solid state drive having a plurality of blocks;
   provide a plurality of error corrective code (ECC) mechanisms, each mechanism having a corresponding correction capability;
   assign to each solid state drive block of the plurality of blocks an error corrective code mechanism of the plurality of ECC mechanisms, according to a reliability of the solid state drive block;
   monitor the reliability of each solid state drive block based on a number of read-retry operations;
   determine the number of read-retry operations associated with a first solid state drive block satisfies a threshold;
   re-assign the first solid state drive block to a different ECC mechanism of the plurality of ECC mechanisms based on the determination; and
   apply, for the first solid state drive block, the different ECC mechanism for data operations in the first solid state drive block.

10. The memory controller of claim 9, wherein the different ECC mechanism is associated with a higher level of error correction than a previous ECC mechanism assigned to the first solid state drive block.

11. The memory controller of claim 9, wherein monitoring the reliability of the first solid state drive block is further based on at least one of a static rule and a dynamic rule.

12. The memory controller of claim 11, wherein the static rule includes at least one of a program-erase cycle of the first solid state drive block and read-retry operation information.

13. The memory controller of claim 11, wherein the dynamic rule includes at least one of a count of correctable errors, and a count of uncorrectable errors.

14. The memory controller of claim 9, wherein the controller module is further configured to determine that the reliability of the first solid state drive block has changed based on an uncorrectable error associated with the first solid state drive block.

15. The memory controller of claim 14, wherein the controller module is further configured to recover data stored in the first solid state drive block.

16. The memory controller of claim 15, wherein the controller module is further configured to determine that the first solid state drive block is corrupted.

* * * * *